United States Patent [19]

Yamagata

[11] Patent Number: 5,070,378
[45] Date of Patent: Dec. 3, 1991

[54] EPROM ERASABLE BY UV RADIATION HAVING REDUNDANT CIRCUIT

[75] Inventor: Yasushi Yamagata, Tokyo, Japan

[73] Assignee: NEC Corporation, Tokyo, Japan

[21] Appl. No.: 679,146

[22] Filed: Mar. 28, 1991

Related U.S. Application Data

[63] Continuation of Ser. No. 410,892, Sep. 22, 1989, abandoned.

[30] Foreign Application Priority Data

Sep. 22, 1988 [JP] Japan .................. 63-239215

[51] Int. Cl.$^5$ ............ H01L 29/68; H01L 27/01; H01L 29/00; H01L 29/78
[52] U.S. Cl. ................. 357/23.5; 357/23.1; 357/59; 357/84; 357/85; 365/53
[58] Field of Search .......... 357/23.5, 23.1, 59, 357/84, 85; 365/53

[56] References Cited

U.S. PATENT DOCUMENTS 4,758,869 6/1988 Eitan et al. .......... 357/23.5
4,805,138 2/1989 McElroy et al. ....... 357/23.5

FOREIGN PATENT DOCUMENTS 58-197777 11/1983 Japan .................. 357/23.5
61-006868 1/1986 Japan .................. 357/23.5
61-049475 3/1986 Japan .................. 357/23.5
62-036869 2/1987 Japan .................. 357/23.5

OTHER PUBLICATIONS

Sze, Semiconductor Devices; Physics & Technology, pp. 468–505, 1985.

Primary Examiner—Andrew J. James
Assistant Examiner—Daniel Kim
Attorney, Agent, or Firm—Foley & Lardner

[57] ABSTRACT

A semiconductor device includes a shield layer selectively formed to cover, via an insulating film, source and drain regions, a control gate electrode, first and second conductive layers and parts of first, second and third polycrystalline silicon layers. The shield layer has a portion which is in contact with the semiconductor substrate and the third polycrystalline silicon layer to surround the source and drain regions, floating and control gate electrodes, the first and second conductive layers and the parts of the first and second polycrystalline silicon layers.

5 Claims, 7 Drawing Sheets

EPROM ERASABLE BY UV RADIATION HAVING REDUNDANT CIRCUIT

This application is a continuation of application Ser. No. 07/410,892, filed Sept. 22, 1989, now abandoned.

BACKGROUND OF THE INVENTION

The present invention relates to a semiconductor device and, more particularly, to a floating-gate EPROM (Electrically Programmable Read Only Memory) whose contents are erasable with UV (Ultra-Violet) radiation (the semiconductor device hereinafter referred to as a "UV-EPROM").

As the memory capacity of a UV-EPROM is increased, it is desirable to it with a redundant circuit, similar to a random access memory with a large memory capacity. The redundant circuit requires storage cells for storing redundant control information used for detecting address data, which designates defective memory cell, order to interchange the defective memory cell with a redundant memory cell. In the UV-EPROM, a floating-gate PROM (Programable Read Only Memory) cell is widely used as the redundant control information storage cells. Floating-gate PROMS have the same structure as EPROM memory cells, because it is convenient to electrically program the redundant control information. However, the redundant control information must not be erased with UV radiation. Therefore, the PROM cell in the redundant circuit can not receive UV radiation.

For this purpose, a metal shield layer is fabricated to cover and surround the PROM cell. However, the metal shield layer cannot completely cover and surround the PROM cell, because interconnection lines extend from the gate and drain thereof so that the redundant control information can be programmed therein. The metal shield layer is isolated from the interconnection lines by an insulating film such as a silicon dioxide film, and consequently the UV radiation or light must first propagate through the insulating film to reach the PROM cell. Hence the redundant control information stored in the PROM cell is only slowly erased.

If only small amounts of radiation UV reaches the PROM cell in the redundant circuit, it takes a long time to erase the redundant control information. In other words, a floating-gate type PROM cell, which is hardly erasable with UV light, is required. For this purpose, prior art teaches forming the metal shield layer over a wide area along the interconnection lines leading from the gate and drain of the PROM cell. As a result, most UV light entering the insulating layer is absorbed when passing therethrough, and only small amounts of UV light can reach the PROM cell. However, this means that the redundant circuit occupies a large area on a semiconductor chip.

SUMMARY OF THE INVENTION

Therefore, an object of the present invention is to provide an improved UV-EPROM having a redundant circuit.

Another object of the present invention is to provide a semiconductor device having a PROM cell, which is hardly erasable with UV light, while simultaneously maintaining a small occupying area thereof.

A semiconductor device according to the present invention comprises a semiconductor substrate having first and second portions. Source and drain regions are formed in the first portion, and a first gate insulating film is formed on a surface of the first portion between the source and drain regions. A floating gate electrode made of polycrystalline silicon is formed on the first gate insulating film. A second gate insulating film is formed on the floating gate electrode, and a control gate electrode made of polycrystalline silicon and is formed on the second gate insulating film. A third insulating film is formed on a surface of the second portion with a thickness substantially equal to that of the first gate insulating film. First and second polycrystalline silicon layers are formed on the third insulating film separate from each other. A first conductive layer interconnects the drain region and the first polycrystalline silicon layer. A second conductive layer interconnects the control gate electrode and the second polycrystalline silicon layer. A fourth insulating film is formed on the first and second polycrystalline silicon layers with a thickness substantially equal to that of the second gate insulating film. A third polycrystalline silicon layer is formed on the third and fourth insulating films crossing the first and second polycrystalline silicon layers. A fifth insulating film covers the entire surface and has a contact hole, which exposes part of the source region and part of the third polycrystalline silicon layer, respectively. A shield layer is formed on the fifth insulating film and contacts parts of the source region and the third polycrystalline silicon layer through the contact hole. Third and fourth conductive layers and extend from the first and second polycrystalline silicon layers, respectively.

Thus, UV light enters only through the third and fourth insulating films and reaches the floating gate electrode. Since the third and fourth insulating films are substantially equal in thickness to the first and second gate insulating films, respectively, they are very thin. As a result, only a small amount of UV light reaches the floating gate. Thus, an EPROM cell, which is hardly erasable with UV light, is realized without enlarging the occupying area thereof. Since the third and fourth insulating films and first, second and third polycrystalline silicon layers can be formed simultaneously with other films and layers constituting a UV-EPROM, respectively, no increase in manufacturing steps is required.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE EMBODIMENTS

Figure 1:
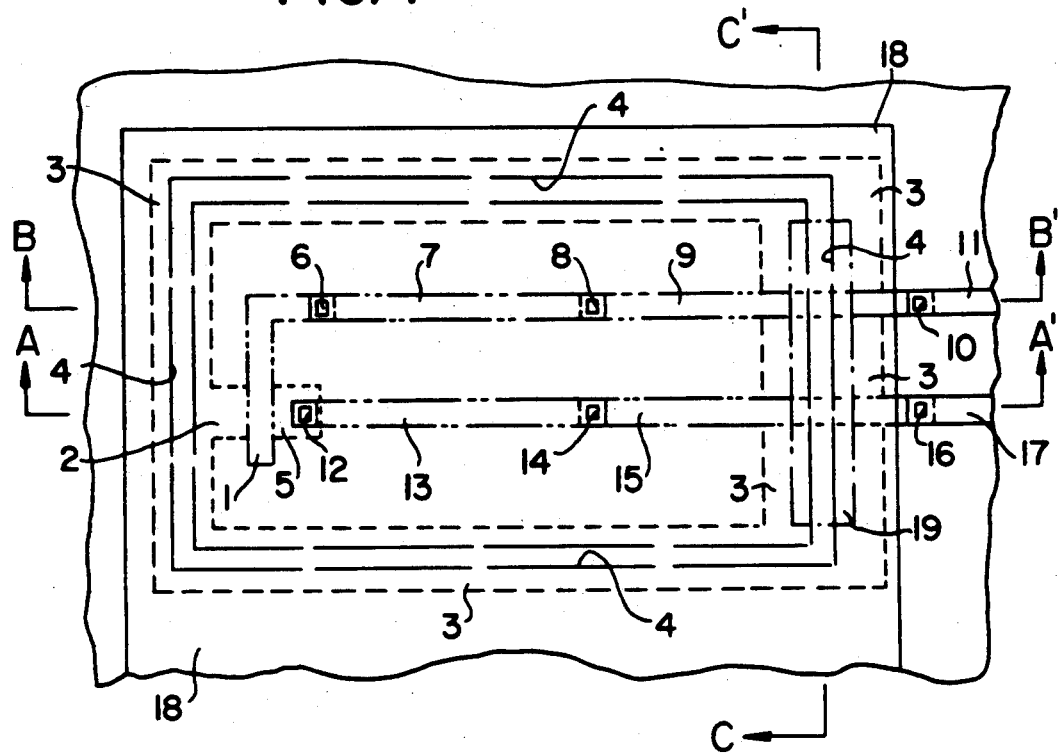
FIG. 1 is a partial plane view representative of an embodiment according to the present invention.
Figure 2A:
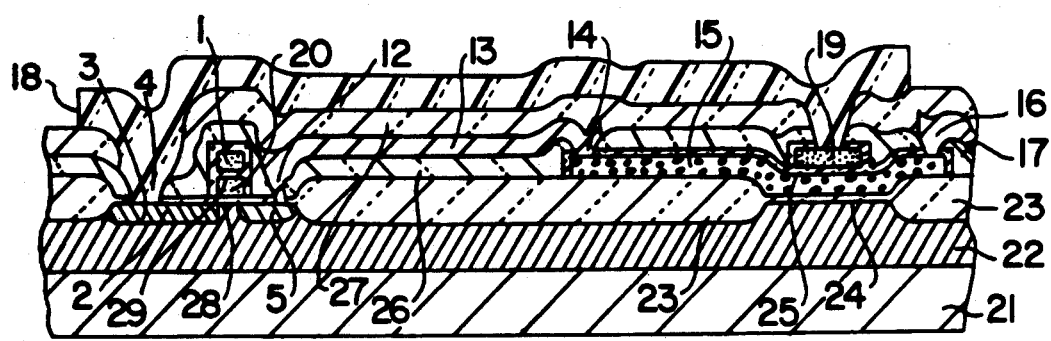
FIGS. 2A, 2B and 2C are cross-sectional views of the device shown in FIG. 1 along lines A—A', B—B' and C—C', respectively.
Figure 2B:
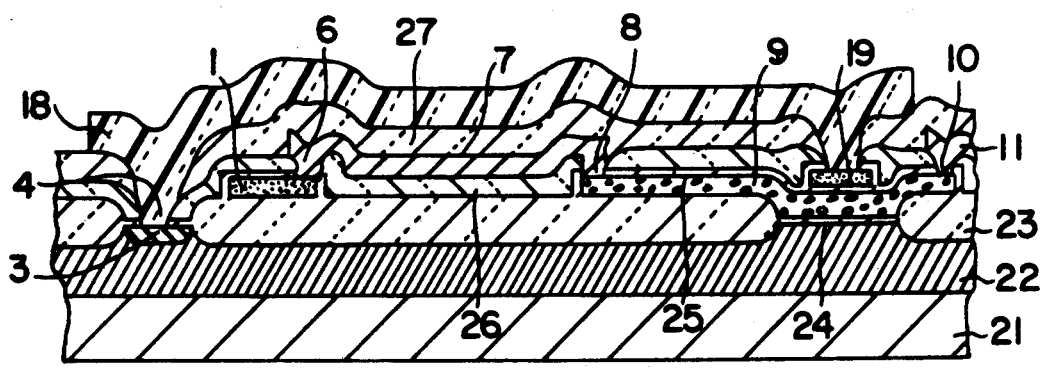
Figure 2C:
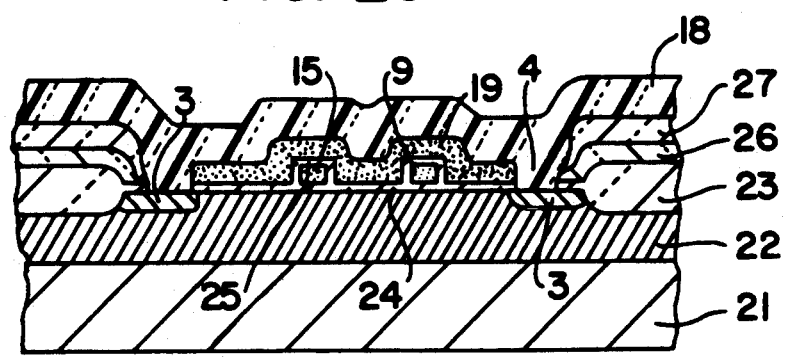

Referring to FIG. 1, there is shown a floating-gate PROM cell for storing redundant control information employed in a UV-EPROM according to an embodiment of the present invention. Cross-sectional views along lines A—A', B—B' and C—C' are shown in FIGS. 2A, 2B and 2C, respectively. Since other sections of the UV-EPROM, such as an EPROM cell array, data programming and read control circuit and so forth, are well known in the art, an therefore their device structures are omitted in the drawings.

The PROM cell for storing the redundant control information includes a control gate 1 made of polycrystalline silicon, a floating gate 20 made of polycrystalline silicon, an N-type source region 2 and an N-type drain region 5, similar to each of the EPROM cells. The source and drain regions 2 and 5 are formed in a P-type well region 22, which is in turn formed in a P-type substrate 21. The floating gate 20 is formed on a first gate insulating film 28 of silicon dioxide covering the surface of the well region 22 between the source and drain regions 2 and 5, respectively. The control gate 1 is formed on a second gate insulating film 29 of silicon dioxide covering the surface of the floating gate 20, and extends over a field insulating layer 23 of silicon dioxide to form an elongated portion. A portion of the control gate 1 is connected through a contact hole 6 to a conductive layer 7. This layer 7 is made of a refractory metal silicide such as tungsten silicide, molybdenum silicide, etc., in this embodiment. If desired, it may be made of a metal such as aluminum. The layer 7 constitutes part of a gate signal line. The drain region 5 is connected through a contact hole 12 to a conductive layer 13 made of the same material as the layer 7. The layer 13 constitutes part of a drain signal line. An insulating film 26 made of, for example, borophosphosilicate glass intervenes between the field insulating layer 23 and each of the layers 7 and 13. The conductive layers 7 and 13 are in turn connected through contact holes 8 and 14 to polycrystalline silicon layers 9 and 15, respectively. These layers 9 and 15 are spread over two field insulating layer portions 23 and an insulating film 24 formed therebetween. The layer 9 constitutes another part of the gate signal line, and the layer 15 constitutes another part of the drain signal line. The insulating film 24 is made of silicon dioxide and has a thickness substantially equal to that of the first gate insulating film 28. The layers 9 and 15 are covered with an insulating film 25 which is made of silicon dioxide and has a thickness substantially equal to that of the second gate insulating film 29. A polycrystalline silicon layer 19 is formed on the insulating films 24 and 25 to cross the layers 9 and 15. The source region 2 is in contact with an N-type layer 3, which is in turn formed in the well region 22 in a ring shape in order to surround the PROM cell, the conductive layers 7 and 13 and parts of the layers 9 and 15. It should be noted that the layer 3 is not formed in surface portions of the well region 22 just under the polycrystalline silicon layers 9, 15 and 19. An insulating layer 27 such as borophosphosilicate glass is deposited over the entire surface, and a contact hole 4 is provided along the layer 3 to expose a par thereof. The contact hole 4 further exposes a part of the layer 19, so that it completely surrounds the PROM cell, the conductive layers 7 and 13 and portions of the layers 9 and 15. A shield layer 18 of aluminum is formed on the insulating layer 27 to cover a portion surrounded by the contact hole 4. The shield layer 18 is further in contact with the layer 3 and the polycrystalline silicon layer 19 to form a wall surrounding the PROM cell. The polycrystalline silicon layers 9 and 15 have respective portions which are outside the shield layer 18, these portions are connected through contact holes 10 and 16 to conductive layers 11 and 17, respectively. These layers 11 and 17 are made of the same material as the conductive layer 7 and constitute remaining parts of the gate and drain signal lines, respectively. Therefore, the control gate 1 and drain region 5 of the PROM cell are led out externally from the shield layer 18 by the gate and drain signal lines (7, 9 and 11) and (13, 15 and 17), respectively.

In the above device structure, the shield layer 18 prevents most UV light from entering and reaching the PROM cell. UV light can only enter the PROM cell and reach the floating gate 20 through the insulating films 24 and 25. Since the insulating films 24 and 25 have thicknesses substantially equal to the first and second gate insulating films 28 and 29, UV light passing through the insulating films 24 and 25 is restricted to slight amounts. Thus, a PROM cell, which is hardly erasable with UV light, is realized. Since the control gate 1 and the drain 5 of the PROM cell are led out from the shield layer 18 without short-circuiting to each other, the redundant control information can be electrically programmed into the PROM cell.

Next, manufacturing steps of the above device will be described with reference to FIGS. 3A to 3G and 4A to 4G.

Figure 3A:
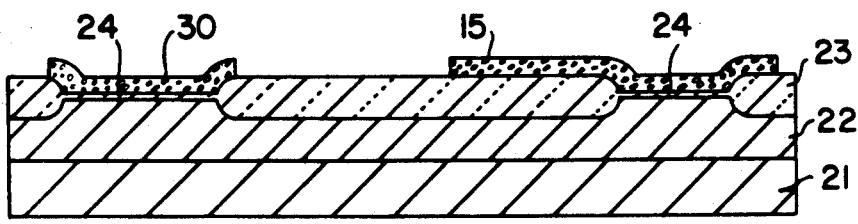
FIGS. 3A to 3G are cross-sectional views representative of manufacturing steps of the device shown in FIG. 1 along line A—A'.
Figure 4A:
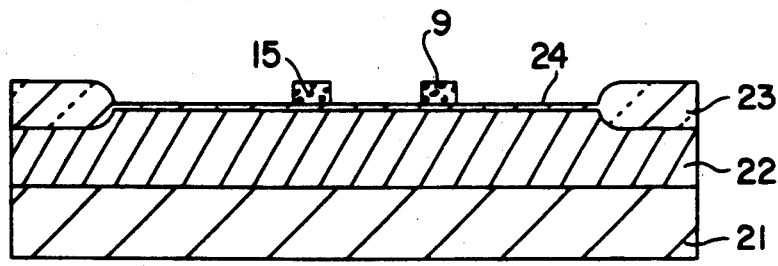
FIGS. 4A to 4G are cross-sectional views representative of manufacturing steps of the device shown in FIG. 1 along line C—C'.

As shown in FIGS. 3A and 4A, a P-type well region 22 is formed in a surface portion of a P-type silicon substrate 21, followed by carrying out the selective oxidation of silicon. As a result, field insulating films 23 of silicon dioxide are selectively formed. Thereafter, thermal oxidation is performed to form insulating films 24 of silicon dioxide. The film 24 on the left side of FIG. 3A will be used as a first gate insulating film. A polycrystalline silicon layer is deposited over the entire surface by CVD (Chemival Vapor Deposition) technique, followed by patterning to form polycrystalline silicon layers 30, 15 and 9. The layer 30 is used as a floating gate.

Figure 3B:
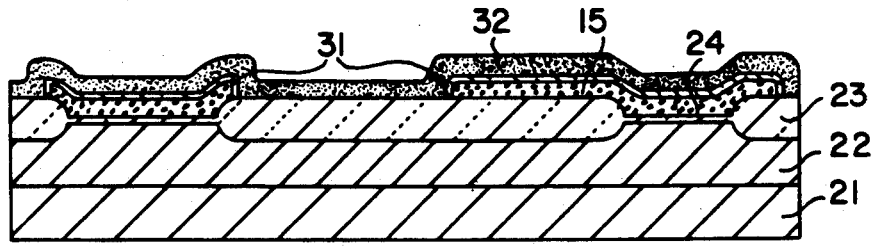
Figure 4B:
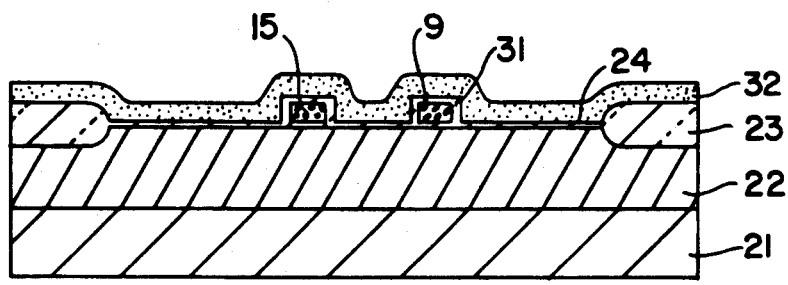

As shown in FIGS. 3B and 4B, thermal oxidation is carried out to cover the layer 30, 15 and 9 with an insulating film 31 of silicon dioxide. The film 31 covering the layer 30 in FIG. 2B is used as a second gate insulating film. A polycrystalline silicon layer 32 is thereafter deposited over the entire surface by the CVD.

Figure 3C:
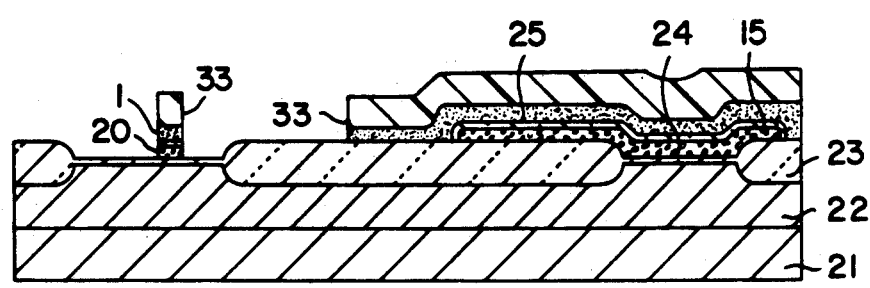
Figure 4C:
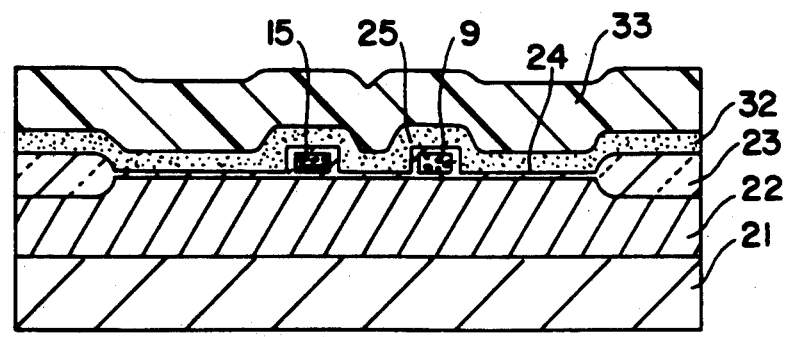

As shown in FIGS. 3C and 4C, mask layers 33 using for example photoresist, are selectively formed. Selective etching is then carried out to form a floating gate 20 and a control gate 1 of the PROM cell. Simultaneously, respective floating and control gates of EPROM cells redundant EPROM cells (not shown) are formed.

Figure 3D:
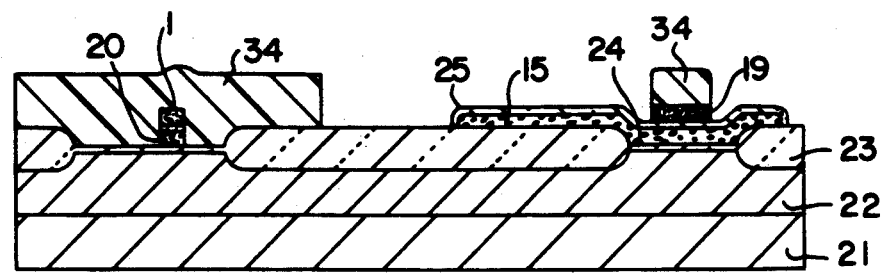
Figure 4D:
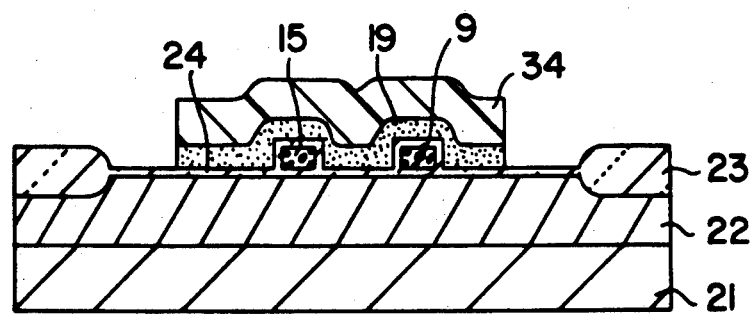

As shown in FIGS. 3D and 4D, the mask layers 33 are removed and new mask layers 34 such as photoresist are then formed. The mask layers 34 cover the PROM cell and the EPROM cells. Selective etching is then carried out to form a polycrystalline silicon layer 19 crossing the layers 15 and 9 via the insulating film 25. Simultaneously, respective gate electrode of transistors (not shown) constituting peripheral circuits such as a data programming and reading circuit, an address decoder circuit and so forth are formed.

Figure 3E:
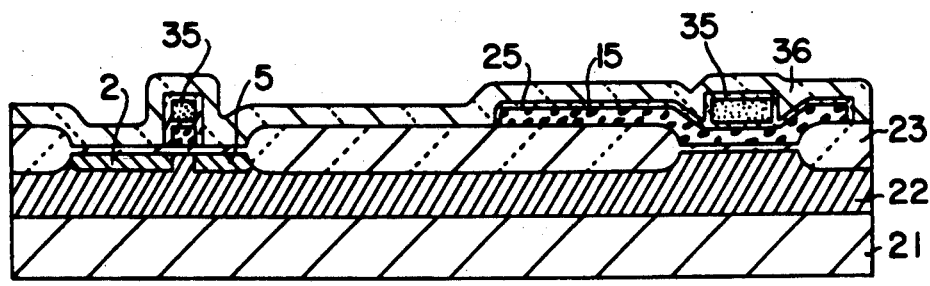
Figure 4E:
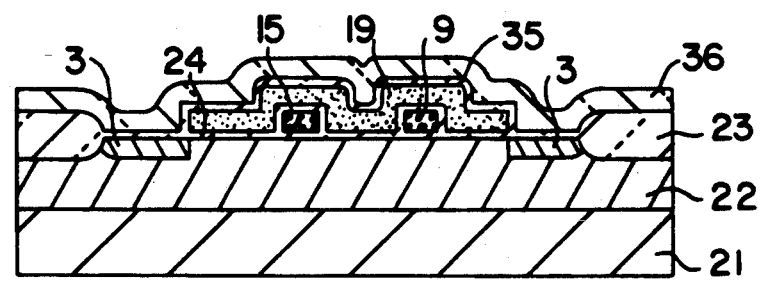

As shown in FIGS. 3E and 4E, the mask layers 34 are removed and thermal oxidation is then performed to cover the exposed surfaces of respective polycrystalline layers 1, 20 and 19. Thereafter, the ion implantation of N-type impurities such as arsenic is carried out to form a drain region 5, a source region 2 and an N-type layer 3. Subsequently, an insulating layer 36 such as borophosphosilicate glass is deposited over the entire surface by means of CVD.

Figure 3F:
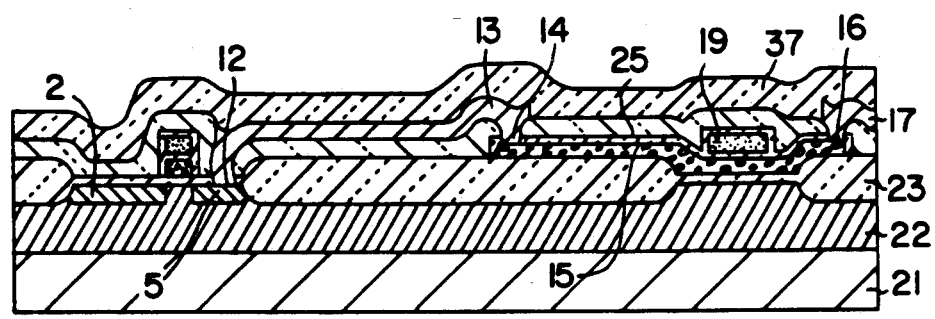
Figure 4F:
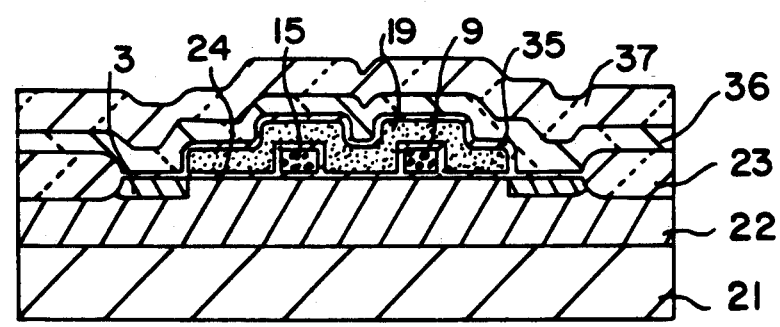

As shown in FIGS. 3F and 4F, contact holes 6, 8, 10, 12, 14 and 16 are selectively formed to expose a part of the control gate 1, a part of the drain region 5, one end portion of the layer 9, the other end portion of the layer 9, one end portion of the layer 15 and the other end portion of the layer 15, respectively. Thereafter, a conductive layer made of refractory metal silicide or aluminum are deposited over the entire surface, followed by selective etching to form the conductive layers 7, 11, 13 and 17. Subsequently, an insulating layer 37 such as borophosphosilicate glass is deposited over the entire surface.

Figure 3G:
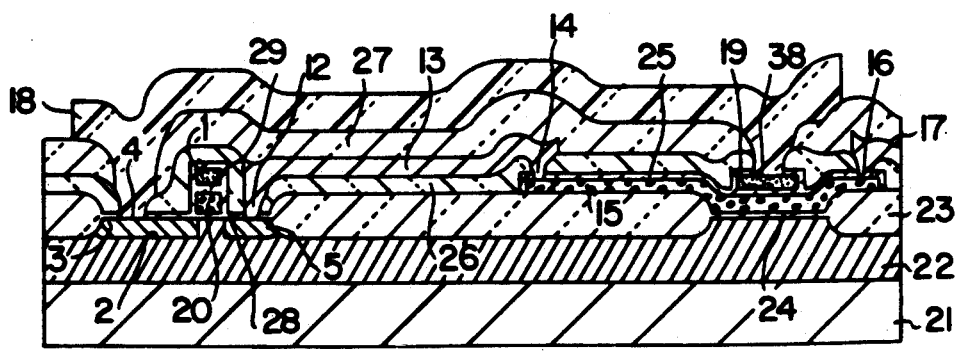
Figure 4G:
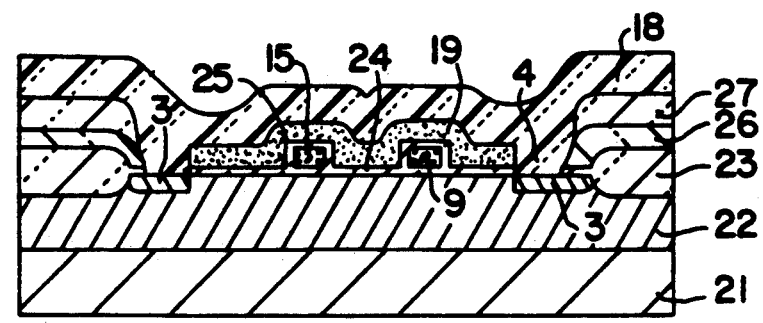

As shown in FIGS. 3G and 4G, a contact hole 4 is formed along the layers 3 and 19 to expose respective parts thereof. Simultaneously, respective parts of source and drain regions of the EPROM cells and redundant EPROM cells are exposed by respective contact holes (not shown). Thereafter, an aluminum layer is deposited over the entire surface, followed by selective etching to form a shield layer 18 also operating as a source electrode of the PROM cell. Simultaneously, respective source and drain electrodes of the EPROM cells are formed.

As a result, the device shown in FIG. 1 is obtained. Since the polycrystalline layers 9, 15 and 19 absorb UV light, only slight UV light passes through the insulating films 24 and 25. The PROM cell thus stores the redundant control information for an extremely long time.

Figure 5:
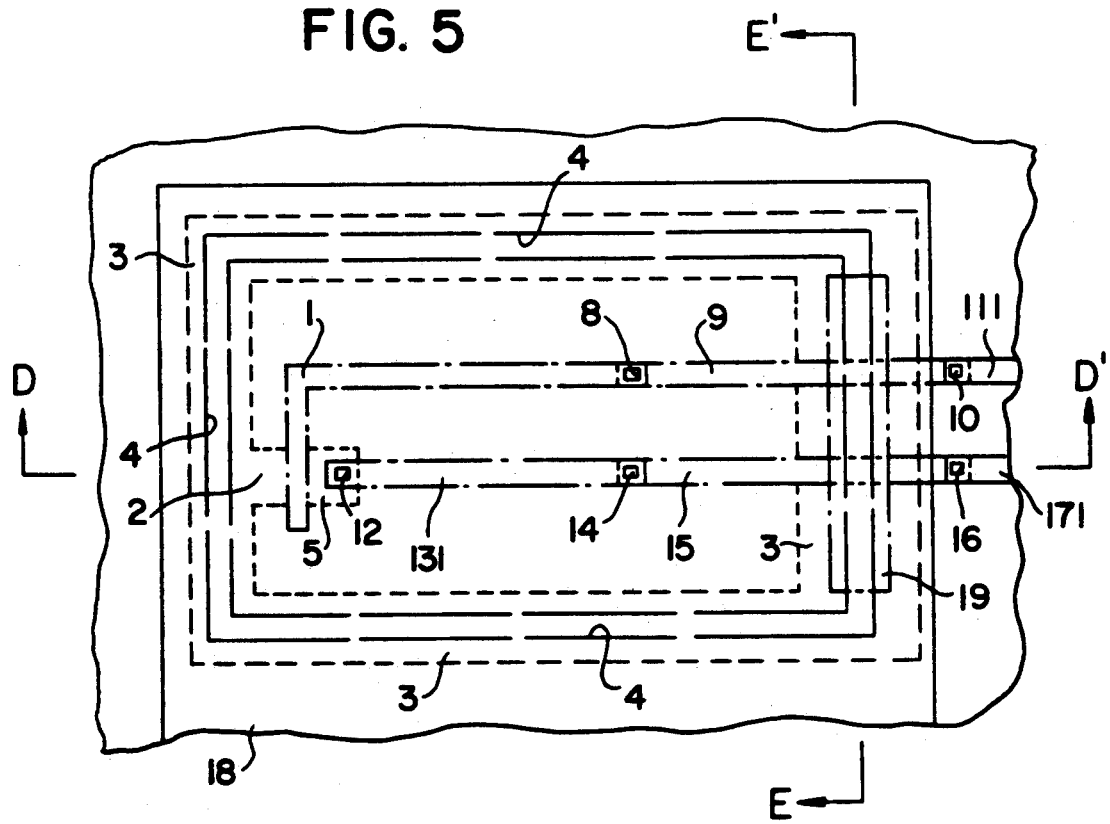
FIG. 5 is a partial plane view representative of another embodiment according to the present invention.
Figure 6A:
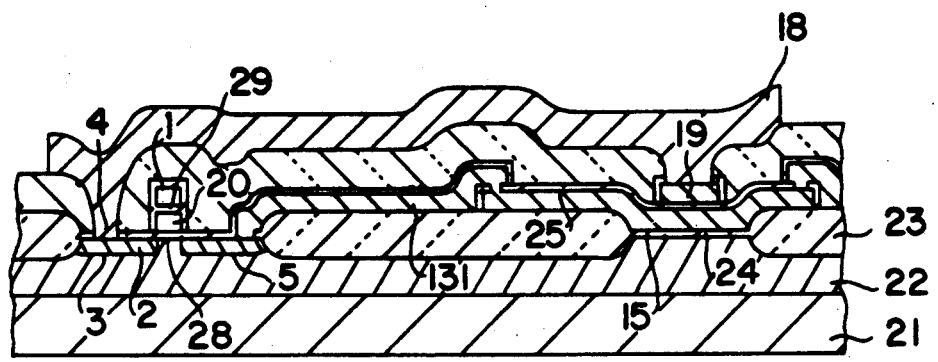
FIGS. 6A and 6B are cross-sectional views of the device shown in FIG. 5 along lines D—D' and E—E'.
Figure 6B:
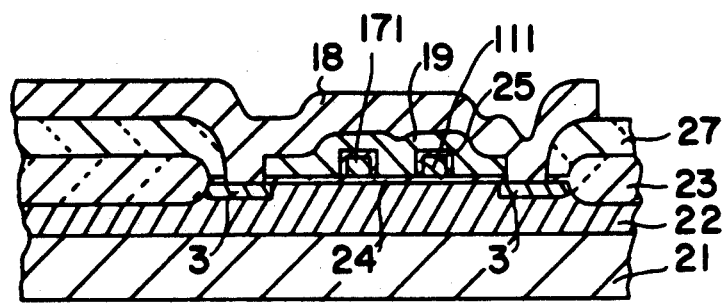

Referring to FIG. 5, there is shown a PROM cell according to another embodiment of the present invention. Cross-sectional views of this cell along lines D—D' and E—E' of FIG. 5 are shown in FIGS. 6A and 6B, respectively. In these drawings, the same constituents as those shown in FIGS. 1 to 4 are denoted by the same reference numerals, and further description thereof is omitted. In this embodiment, the control gate 1 connects via the contact hole 8 to the polycrystalline silicon layer 9. Therefore, the conductive layer 7 shown in FIG. 1 is omitted. The conductive layer 13 shown in FIG. 1 is replaced by a polycrystalline silicon layer 131, which is formed simultaneously with the layer 19. The conductive layers 11 and 17 shown in FIG. 1 are also replaced respectively by polycrystalline silicon layers 111 and 171 which are also formed simultaneously with the layer 19. Since this embodiment requires no conductive layers 7, 13, 11 and 17, the insulating layer 26 (36) is omitted.

Also in this embodiment, only slight UV light enters the PROM cell, the redundant control information is stored for an extremely long time.

The present invention is not limited to the above embodiment, but may be modified and changed without departing from the scope and spirit of the invention. For example, material of the respective insulating films and conductive layers can be changed to other material. The well region 22 may be omitted. A P-channel type PROM cell may be fabricated.

What is claimed is:

1. A semiconductor device comprising:

a semiconductor substrate having first and second portions;
source and drain regions formed in said first portion;
a first gate insulating film formed on a surface of said first portion between said source and drain regions;
a floating gate electrode made of polycrystalline silicon and formed on said first gate insulating film;
a second gate insulating film formed on said floating gate electrode;
a control gate electrode made of polycrystalline silicon and formed on said second gate insulating film;
a third insulating film formed on a surface of said second portion with a thickness substantially equal to the thickness of said first gate insulating film;
first and second polycrystalline silicon layers formed on said third insulating film and separated from each other;
a first conductive layer interconnecting said drain region and said first polycrystalline silicon layer;
a second conductive layer interconnecting said control gate electrode and said second polycrystalline silicon layer;
a fourth insulating film formed on said first and second polycrystalline silicon layers with a thickness substantially equal to the thickness of said second gate insulating film;
a third polycrystalline silicon layer formed on said third and fourth insulating films and crossing said first and second polycrystalline silicon layers; and
a shield layer selectively formed to cover via an insulating film said source and drain regions, said control gate electrode, said first and second conductive layers and parts of said first, second and third polycrystalline silicon layers, said shield layer having a portion which is in contact with said semiconductor substrate and said third polycrystalline silicon layer to surround said source and drain regions, said floating and control gate electrodes, said first and second conductive layers and said parts of said first and second polycrystalline silicon layers.

2. The semiconductor device as claimed in claim 1, said source region is elongated to form an elongated portion reaching said second portion of said semiconductor substrate, and said shield layer contacting said elongate portion of said source region.

3. A semiconductor device comprising:

a semiconductor substrate of one conductivity type;
a strip shape region of an opposite conductivity type selectively formed in said semiconductor substrate, said strip shape region having first and second end portions;
a first insulating film formed on a surface of said semiconductor substrate between said first and second end portions of said strip shape region, said strip shape region and said first insulating film surrounding a portion of said semiconductor substrate;
a transistor formed in said portion of said semiconductor substrate, said transistor including a source region of said opposite conductivity type formed in said portion of said semiconductor substrate in contact with a part of said strip shape region;
a drain region of said opposite conductivity type formed in said portion of said semiconductor substrate;
a second insulating film formed on a surface of said portion of said semiconductor substrate between said source and drain regions with a thickness substantially equal to the thickness of said first insulating film;
a floating gate electrode formed on said second insulating film;
a third insulating film formed on said floating gate electrode;
a control gate electrode formed on said third insulating film;
a first conductive layer crossing said first insulating film;
a second conductive layer crossing said first insulating film;
a fourth insulating film formed on said first and second conductive layers with a thickness substantially equal to the thickness of said third insulating film;
a third conductive layer interconnecting said control gate electrode and said first conductive layer;
a fourth conductive layer interconnecting said drain region and said second conductive layer;
a fifth conductive layer formed on said first and fourth insulating films crossing said first and second conductive layers;

a fifth insulating film covering said strip shape region, said transistor and said first to fifth conductive layers;
a contact hole continuously formed in said fifth insulating film along said strip shape region and said fifth conductive layer, said contact hole surrounding said portion of said semiconductor substrate; and
a shield layer formed on said fifth insulating film to cover said transistor, said shield layer being in contact with said strip shape region and said fifth conductive layer through said contact hole.

4. The semiconductor device as claimed in claim 3, wherein each of said floating and control gate electrodes and said first, second and fifth conductive layers are made of polycrystalline silicon.

5. The semiconductor device as claimed in claim 3, further comprising sixth and seventh conducive layers connected to said first and second conductive layers, respectively, at least one portion of each of said sixth and seventh conductive layers is not covered with said shield layer.

* * * * *